(12) United States Patent
Liao

(10) Patent No.: US 8,434,886 B2
(45) Date of Patent: May 7, 2013

(54) LIGHT EMITTING DIODE, BACKLIGHT MODULE AND LIQUID CRYSTAL DISPLAY APPARATUS

(75) Inventor: Yuan-Hsu Liao, Tainan County (TW)

(73) Assignee: Chimei Innolux Corporation (TW)

( * ) Notice: Subject to any disclaimer, the term of this patent is extended or adjusted under 35 U.S.C. 154(b) by 457 days.

(21) Appl. No.: 12/766,981

(22) Filed: Apr. 26, 2010

(65) Prior Publication Data
US 2010/0271566 A1 Oct. 28, 2010

(30) Foreign Application Priority Data

Apr. 27, 2009 (TW) ................................ 98113884 A

(51) Int. Cl.
G09F 13/04 (2006.01)
G09F 13/08 (2006.01)

(52) U.S. Cl.
USPC .......................................... 362/97.3; 362/612

(58) Field of Classification Search .............. 257/98–99; 362/97.3, 612
See application file for complete search history.

(56) References Cited

U.S. PATENT DOCUMENTS
2007/0272933 A1* 11/2007 Kim et al. ........................ 257/94

* cited by examiner

*Primary Examiner* — Jason Moon Han
(74) *Attorney, Agent, or Firm* — Lowe Hauptman Ham & Berner, LLP

(57) ABSTRACT

A light emitting diode for a backlight module and/or a liquid crystal display apparatus includes a semiconductor structure, a first electrode and a second electrode. The semiconductor structure includes a first type doped semiconductor layer, a light emitting layer, and a second type doped semiconductor layer. The light emitting layer is disposed between the first type doped semiconductor layer and the second type doped semiconductor layer. The first electrode is electrically connected to the first type doped semiconductor layer. The second electrode is electrically connected to the second type doped semiconductor layer. The second electrode is an optical grating which allows light with a first polarization direction to pass through and is capable of reflecting light with a second polarization direction perpendicular to the first polarization direction.

19 Claims, 6 Drawing Sheets

LIGHT EMITTING DIODE, BACKLIGHT MODULE AND LIQUID CRYSTAL DISPLAY APPARATUS

CROSS REFERENCE TO RELATED APPLICATION(S)

This non-provisional application is based on and claims priority under 35 U.S.C. §119(a) from Patent Application No. 98113884 filed in Taiwan, Republic of China on Apr. 27, 2009, the entire content of which is hereby incorporated by reference.

BACKGROUND

1. Technical Field

The present disclosure relates to a light emitting diode (LED), a backlight module and a liquid crystal display (LCD) apparatus.

2. Description of Related Art

As semiconductor technology advances, light emitting diodes (LEDs) have been extensively applied in various applications, such as traffic signs, large display bulletins, scanners and liquid crystal display apparatuses to provide a light source needed by an electronic product.

Typical LEDs are usually semiconductor devices which use III-V compounds, such as GaP, GaAs, and so on. The light emitting principle is to convert electric energy into light. In other words, by applying a current to the compound semiconductor, redundant energy is released in a form of light through the combination of electrons and electron holes, thus achieving a light emitting effect. The LED has advantages of fast response time (about $10^{-9}$ second), small volume, low power consumption, low pollution risk (no mercury contained), high reliability, good adaptation to mass production, and so on, and therefore gradually replaces conventional fluorescent lamps and incandescent bulbs.

However, when the LEDs are applied in an optical system which requires a polarized light source (for example, an LCD apparatus), a polarization converter is needed in the optical system so that the light source generated by the LEDs can be converted in to light with a particular polarization direction by the polarization converter. FIG. 1A is a schematic view of an LCD apparatus 100 known to the inventor(s). The LCD apparatus 100 includes a backlight module 110, a plurality of polarizers 120 and an LCD panel 130. The light generated by the backlight module 110 has no particular polarization type, but includes a combination of P polarized light and S polarized light. Thus, a polarized light source is obtained by the polarizers 120.

However, the polarizers 120 not only increase the manufacturing cost of the LCD apparatus 100, but also reduce the light utilization rate. Specifically, the light with the polarization direction parallel to the transmittance axis of the polarizers 120 can pass through the polarizers 120 whereas the light with the polarization direction perpendicular to the transmittance axis of the polarizers 120 will be absorbed by the polarizers 120. Therefore, only a portion of the light will pass through the polarizers 120 and a portion of light will be shielded. Consequently, the light utilization rate of the backlight module 110 is low and the light utilization effect of the LCD apparatus 100 is not as desired.

SUMMARY

In an aspect, an LED includes a semiconductor structure, a first electrode and a second electrode. The semiconductor structure includes a first type doped semiconductor layer, a light emitting layer and a second type doped semiconductor layer. The light emitting layer is located between the first type doped semiconductor layer and the second type doped semiconductor layer. The first electrode is electrically connected to the first type doped semiconductor layer. The second is electrically connected to the second type doped semiconductor layer. The second electrode is an optical grating which allows light with a first polarization direction to pass through and is capable of reflecting light with a second polarization direction perpendicular to the first polarization direction.

In a further aspect, a backlight module includes an optical plate and at least one LED as described above. The optical plate has a light incident surface and a light emitting surface. The LED is disposed beside the light incident surface.

In another aspect, an LCD apparatus includes a backlight module and an LCD panel. The backlight module includes an optical plate and a plurality of LEDs as described above. The optical plate has a light incident surface and a light emitting surface. The LEDs are disposed beside the light incident surface. The LCD panel is disposed on the light emitting surface.

In yet another aspect, a light source includes first and second electrodes, and a light emitting layer adapted to emit light upon application of a voltage across the light emitting layer via the first and second electrodes. The second electrode is an optical grating for polarizing the light emitted by the light emitting layer.

BRIEF DESCRIPTION OF THE DRAWINGS

The accompanying drawings are included to provide a further understanding of exemplary embodiments of the invention, and are incorporated in and constitute a part of this specification, wherein the same or similar reference numerals relate to the same or similar elements.

DETAILED DESCRIPTION

Figure 1:
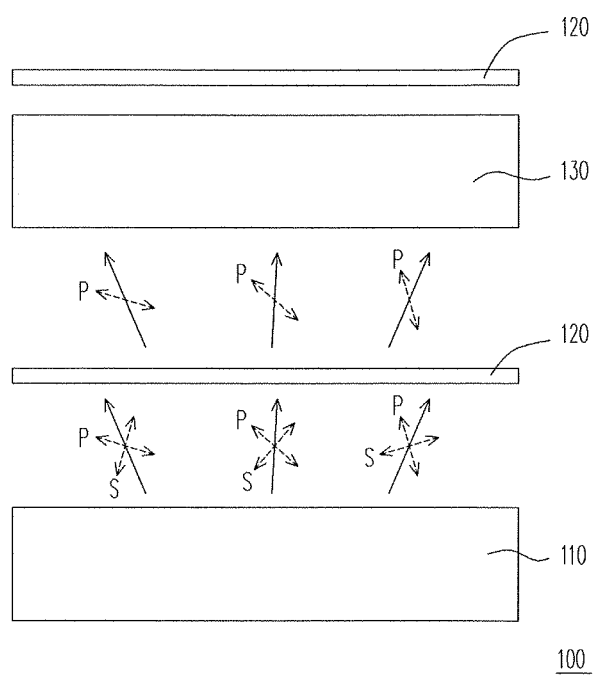
FIG. 1 is a schematic view of a known LCD apparatus.
Figure 2A:
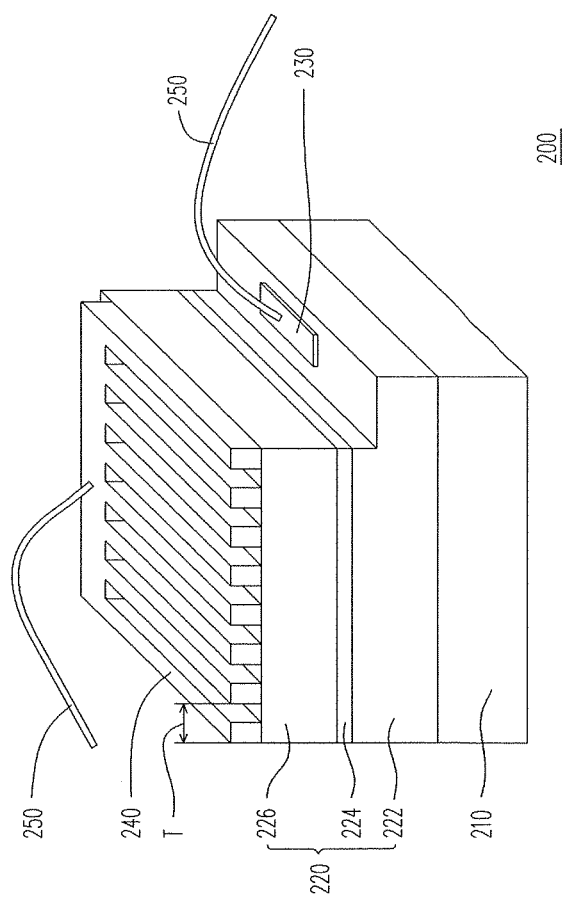
FIG. 2A is a schematic view of an LED structure according to an embodiment of the present invention.

FIG. 2A is a schematic view of an LED structure 200 according to an embodiment of the present invention. Referring to FIG. 2A, the LED 200 includes a substrate 210, a semiconductor structure 220, a first electrode 230 and a second electrode 240. A material of the substrate 210 includes, but is not limited to, for example, sapphire, silicon carbide (SiC), silicon, gallium arsenide (GaAs) or aluminum oxide ($Al_2O_3$).

The semiconductor structure 220 includes a first type doped semiconductor layer 222, a light emitting layer 224 and a second type doped semiconductor layer 226. The first type doped semiconductor layer 222 is disposed on the substrate 210. The light emitting layer 224 is disposed on a portion of the first type doped semiconductor layer 222, and is located between the first type doped semiconductor layer 222 and the second type doped semiconductor layer 226. The second type doped semiconductor layer 226 is disposed on the light emitting layer 224.

The first electrode 230 is disposed on the region of the first type doped semiconductor layer 222 where the light emitting layer 224 is not provided and is electrically connected to the first type doped semiconductor layer 222. The second electrode 240 is disposed on the second type doped semiconductor layer 226 and is electrically connected to the second type doped semiconductor layer 226. Herein, the second electrode 240 is fabricated as an optical grating. A material of the first electrode 230 and the second electrode 240 includes, but is not limited too, for example, aluminum (Al), molybdenum (Mo) or other conductive materials.

In a known LED structure, in order to prevent the emitted light from being shielded by metal, i.e., to improve the light-emitting area, a transparent electrode (for example, Indium Tin Oxide (ITO)) is adopted without using metal. However, the resistance of such a transparent electrode is larger than a metal one, so that a larger voltage is required to drive the LED with a transparent electrode. Therefore, the operating temperature of the LED increases and the luminance of the LED decreases. In addition, a portion of the supplied energy loses in the form of heat.

The second electrode 240 is patterned as the optical grating so that metal is usable as the second electrode 240. Thus, the light generated by the LED 200 is emittable through the optical grating of the second electrode 240 without being significantly shielded by the metal of the second electrode 240. In addition, the second electrode 240 is made from a non-transparent metal with lower resistance than ITO electrodes, so as to drive the LED 200 with a smaller voltage than LEDs with ITO electrodes, thereby decreasing the working temperature of the LED 200 and further improving the luminance of the LED 200. It should be noted that it is within the scope of the present invention to provide embodiments that use any suitable non-metal conductive materials to form the second electrode 240. It should be further noted that to maximize the polarization effect of the optical grating, the optical grating, in some embodiments, occupies entirely, or substantially entirely, the light emitting area of the LED. In the specifically disclosed embodiment of FIG. 2A, the optical grating 240 occupies substantially entirely the upper surface of the second type doped semiconductor layer 226 which is the light emitting area of the LED 200.

Figure 2B:
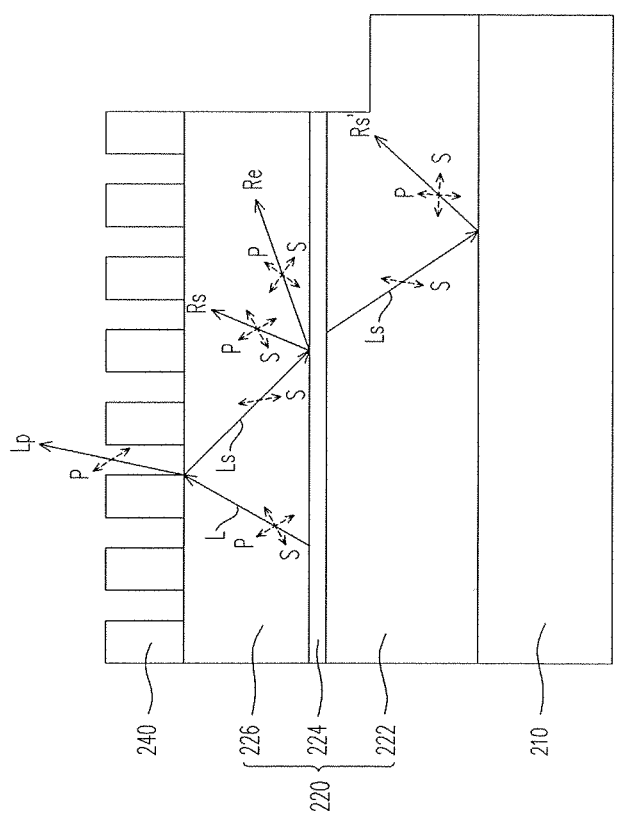
FIG. 2B is a schematic view of the LED in FIG. 2A while emitting light.

To be more specific, in the present embodiment, the LED 200 further includes a plurality of conductive lines 250 connected to the first electrode 230 and the second electrode 240. When a voltage is applied to the first electrode 230 and the second electrode 240 by the conductive lines 250 to drive the first type doped semiconductor layer 222 and the second type doped semiconductor layer 226, electrons and electron holes are generated, respectively. Simultaneously, the electrons and electron move toward each other and are met in the light emitting layer 224 to emit light. FIG. 2B is a schematic view of the LED 200 in FIG. 2A while emitting light. Referring to the FIG. 2B, light L emitted from the light emitting layer 224 does not have a single polarization direction, but includes a first polarization direction P (i.e., P-polarized light) and a second polarization direction S (i.e. S-polarized light). Herein, the first polarization direction P is perpendicular to the second polarization direction S.

By patterning the second electrode 240 as the optical grating, a light portion Lp with the first polarization direction P in the light L passes through the second electrode 240, and a light portion Ls with the second polarization direction S in the light L is reflected by the second electrode 240. In the present embodiment, when the light portion Ls with the second polarization direction S is reflected by the optical grating and then incident on the light emitting layer 224, a scattering light portion Rs is generated. The polarization direction of this scattering light portion Rs is different from that of the original light portion Ls. The scattering light portion Rs has the first polarization direction P and the second polarization direction S, simultaneously, so that when the scattering light portion Rs is incident on the optical grating, a portion with the first polarization direction P in the scattering light portion Rs can pass through the optical grating to increase the light emitting efficiency of the polarized light by the LED 200. In addition, the light emitting layer 224 is configured, in some embodiments, with a surface roughness structure to enhance the scattering efficiency. When the material of the optical grating is metal or a reflective material, the incident angle of the polarized light is satisfied within a larger angle region.

Furthermore, the light portion Ls reflected from the second electrode 240 to the light emitting layer 224 can be absorbed by the light emitting layer 224, and then re-emit as a re-emitted light portion Re with the first polarization direction P and the second polarization direction S.

On the other hand, the light portion Ls can also pass through the light emitting layer 224 into the first type doped semiconductor layer 222 and/or the substrate 210. A scattering light portion Rs' is generated when the light portion Ls meets the first type doped semiconductor layer 222 and/or the substrate 210. The polarization direction of this scattering light portion Rs' is different from that of the original light portion Ls. The scattering light portion Rs' has the first polarization direction P and the second polarization direction S, simultaneously, so that when the scattering light portion Rs' passes through the light emitting layer 224 and is incident on the optical grating, at this time, a portion of the light with the first polarization direction P in the scattering light Rs' can pass through the optical grating for increasing the light emitting efficiency of the polarized light by the LED 200. In addition, the first type doped semiconductor layer 222 and/or the substrate 210 is/are configured, in some embodiments, with a surface roughness structure (not shown) to enhance the scattering efficiency.

In the present embodiment, since the second electrode 240 is an optical grating, an optical grating gap T is configurable to adjust the diffraction order of the diffraction light emitting from the optical grating and/or to make the forward light-emitting of the focused emitting as zero order and/or control the light emitting angle in the required range. For example, when a material of the semiconductor structure 220 is indium gallium nitride (InGaN), which is adapted to emit the red light having a wavelength of 625 nm to 630 nm, the optical grating gap T is smaller than 390 nm in some embodiments. When a material of the semiconductor structure 220 is indium gallium nitride (InGaN) which is adapted to emit the green light having a wavelength of 530 nm to 535 nm, the optical grating gap T is smaller than 290 nm in some embodiments. When a material of the semiconductor structure 220 is gallium nitride (GaN) which is adapted to emit the blue light having a wavelength of 450 nm to 470 nm, the optical grating gap T is smaller than 255 nm in some embodiments. This method can adjust the light passing through the second electrode 240 as primarily zero-order diffraction light.

Figure 3A:
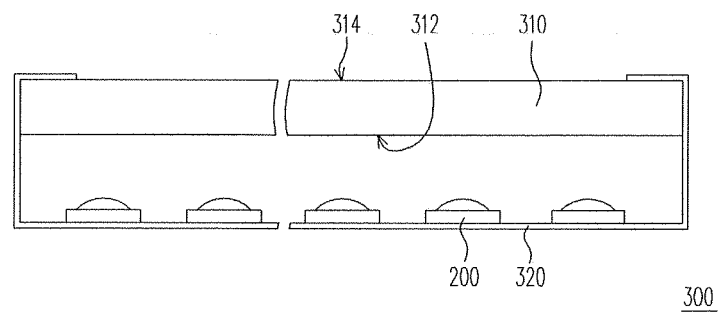
FIG. 3A is a schematic view of a backlight module according to an embodiment of the present invention.
Figure 3B:
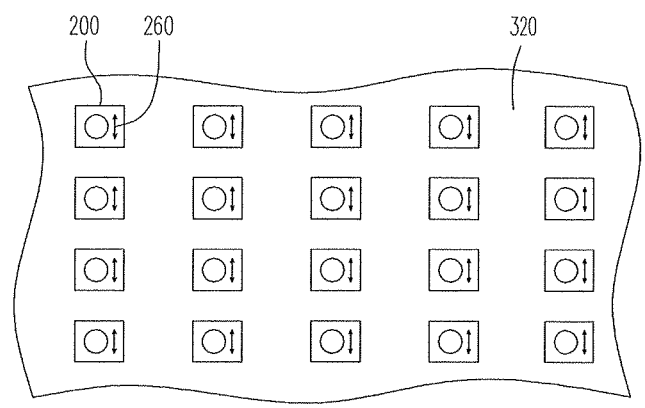
FIG. 3B is a partial top view of the backlight module in FIG. 3A.

FIG. 3A is a schematic view of a backlight module according to an embodiment of the present invention. FIG. 3B is a partial top view of the backlight module in FIG. 3A. Referring to FIGS. 3A and 3B, the backlight module 300 includes an optical plate 310 and a plurality of LEDs 200 as shown in FIG. 2A. Alternatively, the backlight module 300 of the present embodiment further includes a frame 320. The optical plate 310 has a light incident surface 312 and a light emitting surface 314, and the LEDs 200 are disposed beside the light incident surface 312.

In the present embodiment, the backlight module 300 is a direct type backlight module, and the LEDs 200 are disposed on the frame 320 and located below the optical plate 310. The optical plate 310 is, for example, a diffusion plate, and the light incident surface 312 is opposite to the light emitting surface 314 for evenly distributing the forward light emitted from the LEDs 200.

Figure 3C:
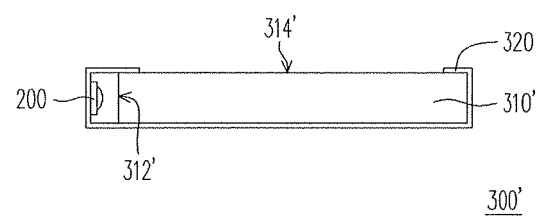
FIG. 3C is a schematic cross-sectional view of a backlight module according to another embodiment of the invention.

FIG. 3C illustrates a schematic cross-sectional view of a backlight module according to another embodiment of the invention. Referring to FIG. 3C, the backlight module 300' of the present embodiment is a side type backlight module and includes a optical plate 310' and a plurality of LEDs 200 as shown in FIG. 2A. Alternatively, the backlight module 300' of the present embodiment further includes a frame 320. The optical plate 310' is a light-guiding plate and has a light incident surface 312' and a light emitting surface 314'. The light incident surface 312' adjoins to the light emitting surface 314', and the LEDs 200 are disposed beside the light incident surface 312' for providing a light source of the side type.

Still referring to FIG. 3B, the LED 200 further includes a package mark 260 for showing the polarization direction of the light provided by LED 200 or the perpendicular direction of the polarization direction of the light provided by LED 200 to facilitate the successive process to adjust all LEDs 200 for providing the light with the same polarization direction. As the LEDs 200 are applied to the backlight source of the display, the display can omit the bottom polarizing film and only use one upper polarizing film, and make the package mark 260 perpendicular or parallel to the transmittance axis direction of the upper polarizing film of the display. It means the polarized light emitted by all the LEDs 200 is perpendicular or parallel to the transmittance axis direction of the upper polarizing film of the display for increasing utility efficiency of light. In some embodiments, the display still includes a bottom polarizing film and the polarized light emitted by all the LEDs 200 is perpendicular or parallel to the transmittance axis direction of the upper polarizing film for increasing the contrast of the display. In the present embodiment, since the backlight module 300 utilizes the LEDs 200, the light source can be provided with a single polarization direction. In addition, the light emitting efficiency can be improved by adjusting the size of the LEDs 200 to control the emitting direction of the LEDs 200 and make the emitting direction of the light source provide by the backlight module 300 to be more focused.

Figure 4:
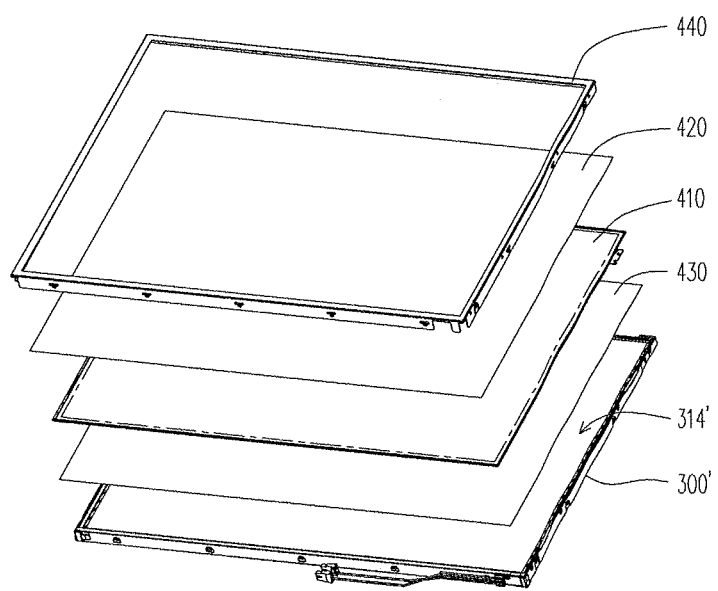
FIG. 4 is a schematic view of an LCD apparatus according to an embodiment of the present invention.

FIG. 4 is a schematic view of an LCD apparatus according to an embodiment of the present invention. Referring to FIG. 4, the LCD apparatus 400 includes a backlight module 300' and an LCD panel 410. In the present embodiment, the backlight module 300' applied in the LCD apparatus 400 is a side type backlight module as exemplarily illustrated in FIG. 3C, and the LCD panel 410 is disposed on the light emitting surface 314' of the backlight module 300'.

In the present embodiment, the LCD apparatus 400 further includes a first polarizer 420 and a frame 440. Herein, the first polarizer 420 is disposed on the LCD panel 410 and is away from the backlight module 300'. The backlight module 300', the LCD panel 410 and the first polarizer 420 are fixed and assembled by the frame 440. When the backlight module 300' is applied in the LCD apparatus 400, since the light emitting efficiency of the backlight module 300' is improved, the LCD apparatus 400 can have better display effects.

In the present embodiment, the LCD apparatus 400 further includes a second polarizer 430 disposed between the LCD panel 410 and the backlight module 300' to ensure that the light transmitting to the LCD panel 410 has a single polarization direction. In some embodiments, the second polarizer 430 is omitted.

To sum up, the LED of embodiments of the present invention utilizes the electrode configuration as an optical grating structure so as to generate a light source with a single polarization direction by the function of the optical grating in addition to improvements in the current distributions effect. In addition, the optical grating gap can be adjusted to different wavelengths to control the order of the diffraction light emitting from the optical grating and/or to focus the emitting direction and/or to limit the light emitting angle appropriately.

Additionally, the light reflected by the electrode configured as the optical grating will change its own original polarization direction upon impinging on the light emitting layer or the substrate and regenerate scattering light with two polarization directions. Therefore, the scattering light with the appropriate one of the polarization directions can pass through the electrode configured as the optical grating to be used for image display. In addition, the light emitting layer absorbs the light reflected by the electrode/optical grating to re-generate light with two polarization directions, and the re-generated light with the appropriate polarization direction can again pass through the electrode etc. With the feature described above, the light emitted by the LED can be used thoroughly.

Therefore, whether the LEDs of embodiments of the present invention are applied in the backlight module or this backlight module is assembled in an LCD apparatus, the above-mentioned effect of the LEDs can improve the effective utilization of light provided by the backlight module and further promote the display quality of the LCD apparatus.

It should be noted that while the exemplary embodiments specifically disclosed herein use LEDs as light sources, it is within the scope of the present invention to provide embodiments that use other types of light sources, e.g., laser diode, organic light emitting device (OLED) or any light emitting unit that has a light emitting material which emits light upon application of an appropriate voltage, e.g., via a pair of electrodes, across the light emitting material, wherein one of the electrodes is configured as an optical grating.

Likewise, while the exemplary embodiments specifically disclosed herein include backlights units and LCDs, it is within the scope of the present invention to provide embodiments that use the disclosed light emitting units (including LEDs) with electrodes configured as optical gratings in any device or application that needs a polarized light source It will be apparent to those skilled in the art that various modifications and variations can be made without departing from the scope or spirit of the invention. In view of the foregoing, it is intended that the present invention cover modifications and variations that fall within the scope of the following claims and their equivalents.

What is claimed is:
1. A backlight module, comprising:
an optical plate that has a light incident surface and a light emitting surface; and
at least one light emitting diode (LED) disposed beside the light incident surface, and comprising:
a semiconductor structure comprising a first type doped semiconductor layer, a light emitting layer, and a second type doped semiconductor layer, wherein the light emitting layer is located between the first type doped semiconductor layer and the second type doped semiconductor layer;

a first electrode electrically connected to the first type doped semiconductor layer; and a second electrode electrically connected to the second type doped semiconductor layer, wherein the second electrode is an optical grating for allowing light with a first polarization direction to pass through and for reflecting light with a second polarization direction perpendicular to the first polarization direction; and a package mark formed on the LED to indicate the first polarization direction or the second polarization direction.

2. The backlight module as claimed in claim 1, wherein said LED further comprises a substrate, the first type doped semiconductor layer is disposed on the substrate, the light emitting layer is disposed on a portion of the first type doped semiconductor layer, the second type doped semiconductor layer is disposed on the light emitting layer, the first electrode is disposed on a region of the first type doped semiconductor layer where the light emitting layer is not disposed, and the second electrode is disposed on the second type doped semiconductor layer.

3. The backlight module as claimed in claim 2, wherein the substrate has a surface roughness structure.

4. The backlight module as claimed in claim 1, wherein the light emitting layer has a surface roughness structure.

5. The backlight module as claimed in claim 1, wherein a material of the semiconductor structure comprises indium gallium nitride adapted to emit red light having a wavelength of 625 nm to 630 nm, and an optical grating gap of the second electrode is smaller than 390 nm.

6. The backlight module as claimed in claim 1, wherein a material of the semiconductor structure comprises indium gallium nitride adapted to emit green light having a wavelength of 530 nm to 535 nm, and an optical grating gap of the second electrode is smaller than 290 nm.

7. The backlight module as claimed in claim 1, wherein a material of the semiconductor structure comprises gallium nitride adapted to emit blue light having a wavelength of 450 nm to 470 nm, and an optical grating gap of the second electrode is smaller than 255 nm.

8. The backlight module as claimed in claim 1, wherein a material of at least one of the first electrode or the second electrode comprises metal.

9. The backlight module as claimed in claim 1, wherein the package mark is visually recognizable from outside the LED.

10. A liquid crystal display (LCD) apparatus, comprising:
a backlight module, comprising:
an optical plate that has a light incident surface and a light emitting surface; and
a plurality of light emitting diodes (LEDs) disposed beside the light incident surface, and each LED comprising:
a semiconductor structure including a first type doped semiconductor layer, a light emitting layer, and a second type doped semiconductor layer, wherein the light emitting layer is located between the first type doped semiconductor layer and the second type doped semiconductor layer;
a first electrode electrically connected to the first type doped semiconductor layer; and
a second electrode electrically connected to the second type doped semiconductor layer, wherein the second electrode is an optical grating for allowing light with a first polarization direction to pass through and for reflecting light with a second polarization direction perpendicular to the first polarization direction; and
a package mark formed on the LED to indicate the first polarization direction or the second polarization direction; and
an LCD panel disposed over the light emitting surface.

11. The LCD apparatus as claimed in claim 10, wherein each LED further comprises a substrate, and in each LED:
the first type doped semiconductor layer is disposed on the substrate,
the light emitting layer is disposed on a portion of the first type doped semiconductor layer,
the second type doped semiconductor layer is disposed on the light emitting layer,
the first electrode is disposed on a region of the first type doped semiconductor layer where the light emitting layer is not disposed, and
the second electrode is disposed on the second type doped semiconductor layer.

12. The LCD apparatus as claimed in claim 11, wherein each substrate has a surface roughness structure.

13. The LCD apparatus as claimed in claim 10, wherein each light emitting layer has a surface roughness structure.

14. The LCD apparatus as claimed in claim 10, wherein at least one of the LEDs is a red LED in which a material of the semiconductor structure comprises indium gallium nitride adapted to emit red light having a wavelength of 625 nm to 630 nm, and an optical grating gap of the second electrode is smaller than 390 nm.

15. The LCD apparatus as claimed in claim 10, wherein at least one of the LEDs is a green LED in which a material of the semiconductor structure comprises indium gallium nitride adapted to emit green light having a wavelength of 530 nm to 535 nm, and an optical grating gap of the second electrode is smaller than 290 nm.

16. The LCD apparatus as claimed in claim 10, wherein at least one of the LEDs is a blue LED in which a material of the semiconductor structure comprises gallium nitride adapted to emit blue light having a wavelength of 450 nm to 470 nm, and an optical grating gap of the second electrode is smaller than 255 nm.

17. The LCD apparatus as claimed in claim 10, wherein, in each LED, a material of at least one of the first electrode or the second electrode comprises metal.

18. The LCD apparatus as claimed in claim 10, being free of any polarizer between the LCD panel and the backlight module.

19. The LCD apparatus as claimed in claim 10, wherein the package mark formed on each of the LEDs is visually recognizable from outside the LED.

* * * * *